US010743447B2

(12) United States Patent
Murai et al.

(10) Patent No.: US 10,743,447 B2
(45) Date of Patent: Aug. 11, 2020

(54) COMPONENT MOUNTING MACHINE
(71) Applicant: FUJI MACHINE MFG. CO., LTD., Chiryu-shi (JP)
(72) Inventors: Masaki Murai, Nishio (JP); Toshihiko Yamasaki, Nisshin (JP); Toshinori Shimizu, Kariya (JP)
(73) Assignee: FUJI CORPORATION, Chiryu-shi (JP)
(*) Notice: Subject to any disclaimer, the term of this patent is extended or adjusted under 35 U.S.C. 154(b) by 241 days.
(21) Appl. No.: 15/553,652
(22) PCT Filed: Feb. 26, 2015
(86) PCT No.: PCT/JP2015/055565
§ 371 (c)(1),
(2) Date: Aug. 25, 2017
(87) PCT Pub. No.: WO2016/135915
PCT Pub. Date: Sep. 1, 2016
(65) Prior Publication Data
US 2018/0035582 A1    Feb. 1, 2018
(51) Int. Cl.
H05K 13/08 (2006.01)
G06T 1/00 (2006.01)
H01L 21/52 (2006.01)
G06T 7/73 (2017.01)
H04N 5/232 (2006.01)
H04N 5/247 (2006.01)
(Continued)
(52) U.S. Cl.
CPC .............. *H05K 13/08* (2013.01); *G06T 1/00* (2013.01); *G06T 7/0004* (2013.01); *G06T 7/73* (2017.01);
(Continued)
(58) Field of Classification Search
CPC .... H04N 5/247; H05K 13/08; H05K 13/0812; H05K 13/0815; H05K 1/0269; H05K 2201/09918; G06T 1/00; G06T 2207/30141
See application file for complete search history.

(56) References Cited

U.S. PATENT DOCUMENTS 4,896,206 A * 1/1990 Denham ............... H01L 21/681
                                                         348/87
6,211,912 B1 * 4/2001 Shahraray ............ G11B 27/11
                                                         348/228.1
(Continued)

FOREIGN PATENT DOCUMENTS

JP       2004-134443 A     4/2004
JP        2005-93906 A     4/2005
(Continued)

OTHER PUBLICATIONS

Extended European Search Report dated Feb. 16, 2018 in European Patent Application No. 15883209.7, 9 pages.
(Continued)

Primary Examiner — Minh N Trinh
(74) Attorney, Agent, or Firm — Oblon, McClelland, Maier & Neustadt, L.L.P.

(57) ABSTRACT

A component mounting machine mounts components having a component mark for positioning on an upper face on a circuit board. The component mounting machine has a first suction nozzle that sucks a component, a transfer head that mounts the component on a circuit board, an optical path conversion device disposed above a suction surface and converts the optical path of light from the upper face of the component to the side, a camera that receives light that is changed in an optical path, a camera moving device that moves the camera, and a control device controlling operation of the transfer head and the camera moving device. The camera moving device moves the camera in a first direction orthogonal to an optical axis of the camera, and an imaging region of the camera moves in a second direction when the camera moves in the first direction.

9 Claims, 8 Drawing Sheets (51) Int. Cl.
*H05K 1/02* (2006.01)
*G06T 7/00* (2017.01)

(52) U.S. Cl.
CPC ......... *H01L 21/52* (2013.01); *H04N 5/23296* (2013.01); *H04N 5/247* (2013.01); *H05K 1/0269* (2013.01); *H05K 13/0812* (2018.08); *H05K 13/0815* (2018.08); *G06T 2207/30141* (2013.01); *G06T 2207/30204* (2013.01); *H05K 2201/09918* (2013.01)

(56) References Cited

U.S. PATENT DOCUMENTS

| | | | | |
|---|---|---|---|---|
| 8,899,293 | B2* | 12/2014 | Suhara | B65H 37/002 |
| | | | | 156/538 |
| 9,642,295 | B2* | 5/2017 | Teshima | H05K 13/0469 |
| 2005/0225631 | A1 | 10/2005 | Van Der Sanden et al. | |
| 2018/0035582 | A1* | 2/2018 | Murai | H05K 1/0269 |

FOREIGN PATENT DOCUMENTS

| | | |
|---|---|---|
| JP | 2005-123372 A | 5/2005 |
| JP | 2007-287838 A | 11/2007 |
| JP | 2009-158876 A | 7/2009 |
| WO | WO 03/41478 A1 | 5/2003 |

OTHER PUBLICATIONS

International Search Report dated Jun. 2, 2015, in PCT/JP2015/055565 filed Feb. 26, 2015.

\* cited by examiner

FIF.7B

FIG.9

COMPONENT MOUNTING MACHINE

TECHNICAL FIELD

A technique that is disclosed in the present description relates to a technique for positioning of a component mounting machine that mounts an electronic component on a circuit board.

BACKGROUND ART

A mounting device that positions a chip that is given a recognition mark for positioning and a board that is given a recognition mark for positioning is disclosed in PTL 1 (International Publication No. 2003/041478). The mounting device in PTL 1 is provided with a tool that sucks the chip, a prism, that converts an optical path of light from each recognition mark for positioning in the tool to the side of the tool, and recognition means that receives light of which the optical path is changed using the prism. Positioning of the chip and the board is performed by recognizing the recognition mark for positioning of the chip and the recognition mark for positioning of the board using the recognition means.

SUMMARY

In the component mounting machine, multiple types of electronic components are mounted on the circuit board. When the types of electronic components are different from each other, the positions of the recognition marks for positioning that are given to the electronic components may be different from each other since the sizes or shapes of the electronic components are different from each other. In the mounting device in PTL 1, a case where the positions of the recognition marks for positioning that are given to the electronic components are different from each other is not assumed, it is necessary to adjust the position of a camera such that the recognition marks for positioning that are applied to the electronic components are positioned inside an imaging region of the camera when the recognition marks for positioning that are given to the electronic components are not present in the image that is imaged by the camera. When the position of the camera is adjusted, there is a problem in that mounting efficiency of the electronic components is low since time for adjustment is necessary.

A component mounting machine that is disclosed in the present description mounts components having a component mark for positioning on an upper face on a circuit board. The component mounting machine has a first suction nozzle that is provided with a suction surface that sucks the upper face of the component, a transfer head that supports the first suction nozzle and mounts the component that is sucked by the first suction nozzle on the circuit board by moving the first suction nozzle relatively to the circuit board, optical path conversion means that is disposed above the suction surface and converts an optical path of light from the upper face of the component to the side, a first camera that is disposed at a position at which it is possible to receive, from the upper face of the component, light which is changed in the optical path by the optical path conversion means, a camera moving device that moves the first camera relatively to the first suction nozzle, and a control device that controls operation of the transfer head and the camera moving device. The camera moving device moves the first camera in at least a first direction that is orthogonal to an optical axis of the first camera; and an imaging region of the first camera moves in a second direction with respect to the center of the component when the first camera moves in the first direction. The control device is provided with a memory section that stores in advance positional information of a component mark, causes the first suction nozzle to suck the component, and causes the first camera to move by the camera moving device based on the positional information within the memory section.

In the component mounting machine, the control device is able to cause the first camera to move based on positional information of the component mark since the positional information of the component mark is stored in the memory section. When configuring in this manner, it is possible to shorten the time that is necessary for setting the component mark in the imaging region of the camera even in a case where the position of the component mark in each type of component is different from each other.

DESCRIPTION OF EMBODIMENTS

Key features of an embodiment that will be described below are listed. Note that, technical elements that will be described below are technical elements that are independent of each other, exhibit technical usefulness using one or various combinations, but are not limited to the combination as claimed at the time of filing.

(Feature 1) A control device may position a component mark within an imaging region of a first camera by further moving the first camera using a camera moving device when the component mark is not positioned within the imaging region of the first camera in a case where the component is sucked by a first suction nozzle and the first camera is moved by the camera moving device based on positional information within a memory section. When configuring in this manner, it is possible to position the component mark within the imaging region of the first camera even when the component mark is not positioned within the imaging region of the first camera in a case where the first camera is moved based on positional information within a memory section.

(Feature 2) The first camera may be disposed on an optical path that is changed by the optical path conversion means, the camera moving device may move the first camera in at least an up-down direction with respect to the first suction nozzle, and the imaging region of the first camera may move in a direction that is parallel to the optical path that is changed by the optical path conversion means with respect to the center of the component when the first camera moves in the up-down direction. The control device may causes suction nozzle to suck the component, and may cause the first camera to move in the up-down direction by the camera moving device based on the positional information within the memory section. When configuring in this manner, it is possible to adjust the imaging region of the first camera by moving the first camera in the up-down direction since light that is changed in the optical path by the optical path conversion means is imaged by the first camera.

(Feature 3) The control device may position the component mark within the imaging region of the first camera by further moving the first camera in the up-down direction using the camera moving device when the component mark is not positioned within the imaging region of the first camera in a case where the component is sucked by the first suction nozzle and the first camera is moved by the camera moving device based on positional information within the memory section. When configuring in this manner, it is possible to position the component mark within the imaging region of the first camera even when the component mark is not positioned within the imaging region of the first camera.

(Feature 4) A circuit board may have a board mark for positioning, the optical path conversion means may convert an optical path of light from the upper face of the circuit board to the side, and the first camera may be disposed at a position at which it is possible to receive, from the upper face of the circuit board, light that is changed in the optical path by the optical path conversion means. The control device may determine the mounting position of the component on the circuit board based on the relative positions of the component mark and the board mark that are imaged by the first camera. When configuring in this manner, it is possible to determine the mounting position of the component on the circuit board based on the relative position of the component mark and the board mark that are imaged by the first camera. Therefore, it is possible to improve accuracy of positioning of the component and the circuit board.

(Feature 5) The control device may position both of the component mark, and the board mark within the imaging region of the first camera by moving the first camera using the camera moving device. When configuring in this manner, it is possible to position the component and the circuit board in a state in which the component mark and the board mark are imaged by the first camera. Therefore, it is possible to improve accuracy of positioning of the component and the circuit board.

(Feature 6) The control device may position the imaging region of the first camera such that the center point of the imaging region of the first camera and the center point of the component mark and the board mark, overlap by moving the first camera using the camera moving device. When configuring in this manner, it is possible to prevent the board mark, or the component mark from coming away from the imaging region of the first camera when the component or the circuit board is moved to the mounting position. Therefore, there is a high possibility that it is possible to position the component and the circuit board at the mounting position in a state in which the component mark and the board mark are imaged by the first camera. As a result, it is possible to improve mounting accuracy of the component on the circuit board.

(Feature 7) The component mounting machine may further have a second suction nozzle that is provided with a suction surface that sucks the upper face of the component and optical path conversion means that is disposed above the suction surface and converts the optical path of the light from the upper face of the component to the side, and a second camera that is disposed at a position at which it is possible to receive light, from the upper face of the component that is sucked by the second suction nozzle, which is changed in the optical path by the optical path conversion means of the second suction nozzle. The transfer head may support the first suction nozzle and the second suction nozzle and mount the component that is sucked by the first suction nozzle and the second suction nozzle on the circuit board fay moving the first suction nozzle and the second suction nozzle relatively to the circuit board, the first camera and the second camera may be disposed such that the optical axis of the first camera and the optical axis of the second camera are parallel, and the camera moving device may relatively move each of the first camera and the second camera in a direction that is orthogonal to the optical axis with respect to the first suction nozzle and the second suction nozzle. The control device may control the operation of the transfer head and the camera moving device based or captured image data of the first camera and captured image data of the second camera. When configuring in this manner, it is possible to simultaneously suck and image two components. Thereby, it is possible to shorten the time that is necessary for mounting of the component on the circuit board.

(Feature 8) The first camera, the second camera, and the camera moving device may be attached to the transfer head and relatively move integrally with the transfer head with respect to the circuit board. The control device may inspect a surface state of each component that is sucked by the first suction nozzle and the second suction nozzle by using the captured image data of the first camera and the captured image data of the second camera after a component is sucked by each of the first suction nozzle and the second suction nozzle until mounting the component on the circuit board in a case where the component is sucked by each of the first suction nozzle and the second suction nozzle and is mounted on the circuit board. When configuring in this manner, if the component is sucked by each of the first suction nozzle and the second suction nozzle, it is possible to image the component, which is sucked by each of the first suction nozzle and the second suction nozzle, using the first camera and the second camera. Thereby, it is possible to inspect the surface state of each component using the captured image data of the first camera and the second camera prior to mounting each of the components on the circuit board. As a result, it is possible to suppress mounting of the component on the circuit board that is abnormal in the surface state.

First Embodiment

A component mounting machine 10 according to a first embodiment will be described below. The component mounting machine 10 is a device that mounts an electronic component 4 on a circuit board 2. The component mounting machine 10 is referred to as a surface mounting machine a chip mounter, or the like. The component mounting machine 10 is placed next to a solder printing machine, another component mounting machine, and a board inspection machine, and is constituted by a mounting line in series.

Figure 1:
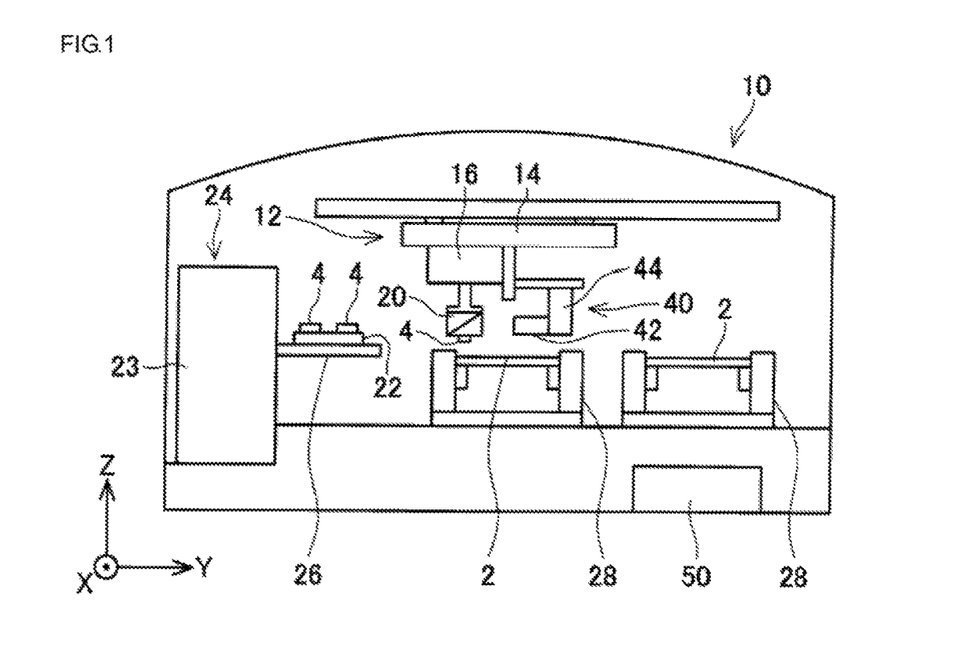
FIG. 1 is a side view schematically illustrating a configuration of a component mounting machine of a first embodiment.

As shown in FIG. 1, the component mounting machine 10 is provided with a tray feeder 24, a head unit 12, a moving device 14 that moves the head unit 12, an imaging unit 40 that is applied to the head unit 12, a board conveyor 28, and a control device 50. The tray feeder 24 is provided with a housing 23, a tray 22 that stores multiple electronic components 4, and a tray conveyance mechanism 26 that puts in and takes out the tray 22 from the housing 23. The housing 23 accommodates multiple trays 22. The tray conveyance mechanism 26 moves one of the multiple trays 22 that are accommodated in the housing 23 between a position (suckable position) that is drawn out from the housing 23 and a position (non-suckable position) that is stored in the housing 23. The electronic component 4 in the tray 22 that is conveyed to the suckable position is sucked by the head unit 12. A tape feeder or the like that accommodates multiple electronic components 4 on a tape may be set as a mechanism that supplies the electronic components 4.

The moving device 14 moves the head unit 12 in the X-direction and the Y-direction. The moving device 14 is constituted by a guide rail that guides the head unit 12, a moving mechanism that moves the head unit 12 along the guide rail, a motor that drives the moving mechanism, and the like. The moving device 14 is disposed above the tray 22 and the circuit board 2. The head unit 12 moves a cavity above the tray 22 and above the circuit board 2 using the moving device 14.

The board conveyor 28 is a device that carries out taking in of the circuit board 2 to the component mounting machine 10, positioning at the component mounting position, and taking out from the component mounting machine 10. For example, it is possible to constitute the board conveyor 28 using a pair of belt conveyors, a board holding, section (not illustrated) that supports the circuit board 2 from below while attached to the belt conveyors, and a driving device that drives the belt conveyors.

Figure 2:
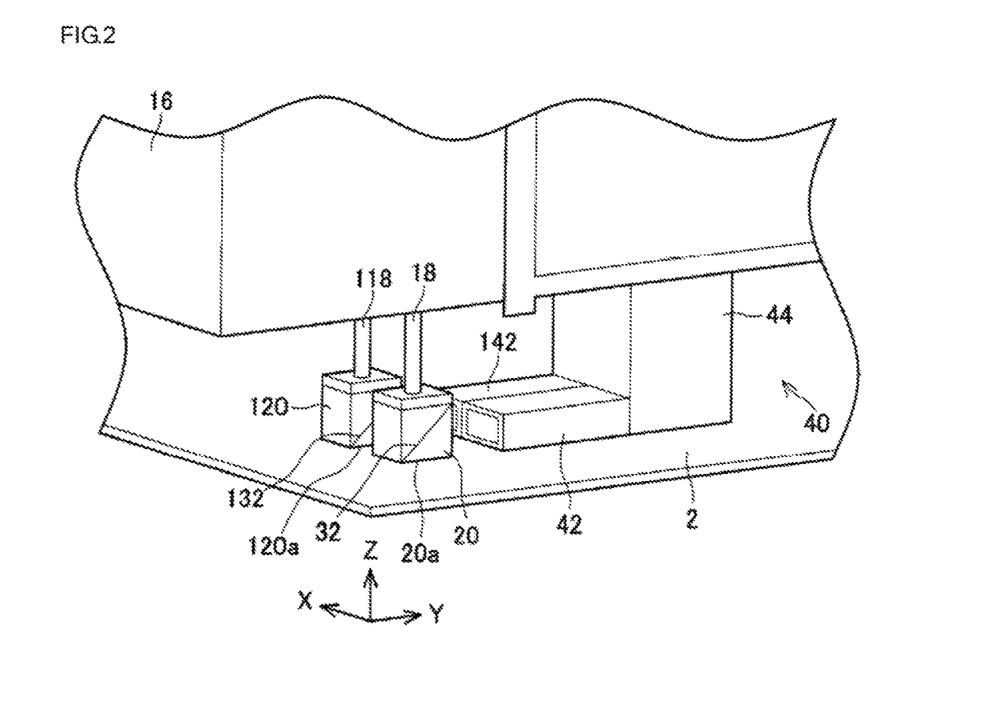
FIG. 2 is a perspective view illustrating a configuration of a head unit and an imaging unit of the first embodiment.

As shown in FIGS. 1 and 2, the head unit 12 is provided with a transfer head 16, and a first suction nozzle 20 and a second suction nozzle 120 that are attached to the transfer head 16. The first suction nozzle 20 is disposed spaced apart in the X-direction with respect to the second suction nozzle 120. Here, the first suction nozzle 20 will be described in detail since the first suction nozzle 20 and the second suction nozzle 120 have the same configuration. The first suction nozzle 20 is attached to the transfer head 16 that is movable in the up-down direction (Z-direction in the drawings). The first suction nozzle 26 ascends or descends in the up-down direction due to an actuator (not illustrated) that is accommodated in the transfer head 16, or is configured to be able to suck the electronic component 4. First, in mounting of the electronic component 4 on the circuit board 2 by the transfer head 16, the first suction nozzle 20 is moved downward until a lower face (suction surface) of the first suction nozzle 20 abuts with the electronic component 4 that is stored in the tray 22. Next, the electronic component is sucked by the first suction nozzle 20, and the first suction nozzle 20 is moved upward. Next, the transfer head 16 is positioned with respect to the circuit board 2 by the moving device 14. Next, the electronic component 4 is mounted on the circuit board 2 by lowering the first suction nozzle toward the circuit board 2.

The imaging unit 40 is attached to the head unit 12. Therefore, when the head unit 12 moves, the imaging unit 40 integrally moves with the head unit 12. The imaging unit 40 is provided with a camera moving device 44, a first camera 42, and a second camera 142. The first camera 42 and the second camera 142 are attached to the camera moving device 44. The camera moving device 44 is attached to the head unit 12, and the first camera 42 and the second camera 142 are moved in the Y-direction and the Z-direction relatively to the head unit 12. The first camera 42 and the second camera 142 are disposed lined up in the X-direction. The first camera 42 is disposed at the side of the first suction nozzle 20 (Y-direction in the drawings), and the second camera 142 is disposed at the side of the second suction nozzle 120 (Y-direction in the drawings). The first camera 42 and the second camera 142 are attached to the camera moving device 44 such that the positions of the first camera 42 in the Y-direction and the Z-direction are set to be the same as the respective positions of the second camera 142 in the Y-direction and the Z-direction.

Figure 3:
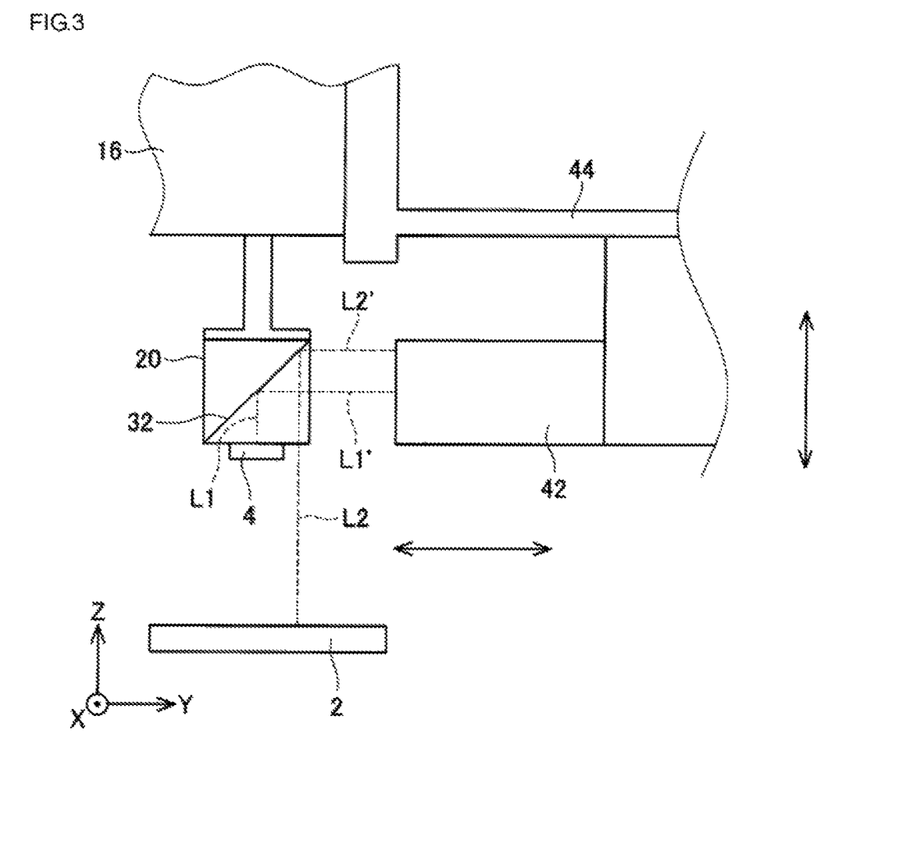
FIG. 3 is a side view illustrating a configuration of the head unit and the imaging unit of the first embodiment.

Here, an imaging method using the head unit 12 and the imaging unit 40 will be described using FIG. 3. As shown in FIG. 3, the first suction nozzle 20 is provided with a first mirror 32 above an electronic component suction surface 20a. The first mirror 32 converts an optical path L1 of light that is reflected from the upper face of the electronic component 4 to an optical path L1' at the side of the first suction nozzle 20 (Y-direction in the drawings). In addition, the first mirror 32 converts an optical path L2 of light from the upper face of the circuit board 2 to an optical path L2 at the side of the first suction nozzle 20 (Y-direction in the drawings). In place of the mirror, a prism or the like may be used as means for converting the optical path of the light that is reflected from the upper face of the electronic component 4. As described above, the first camera 42 is disposed at the side of the first suction nozzle 20. Therefore, it is possible for the first camera 42 to receive light from the upper face of the electronic component 4 and light from the upper face of the circuit board 2. That is, it is possible to image the upper face of the electronic component 4 and the upper face of the circuit board 2. Note that, the second suction nozzle 120 is provided with a second mirror 132 in the same manner as the first suction nozzle 20, and it is possible for the second suction nozzle 120 to receive light from the upper face of the electronic component 4 and light from the upper face of the circuit board 2 that are changed in the optical path by the second mirror 132.

Figure 6:
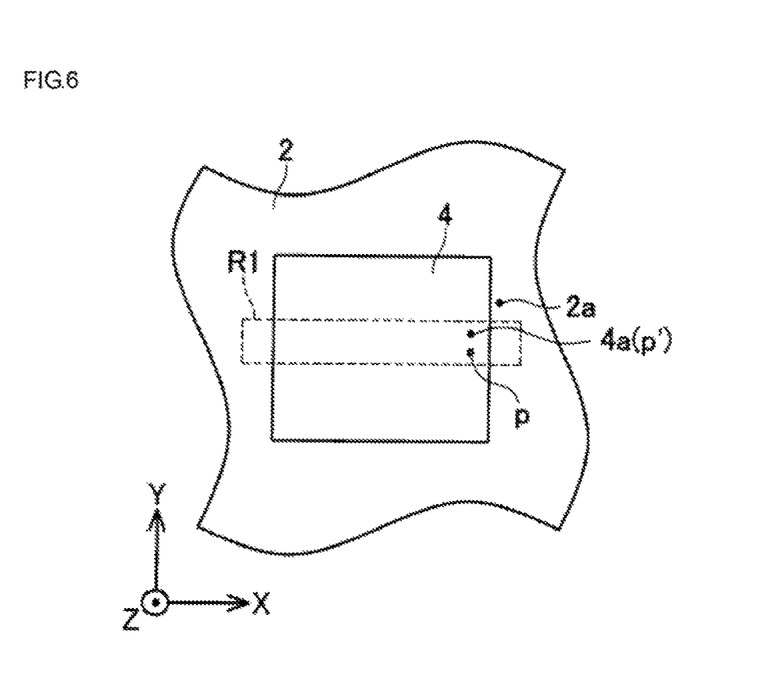
FIG. 6 is a diagram illustrating an example of a state in which a component mark is set in an imaging region of a first camera in a case where the first camera is positioned based on positional information within a memory section.

As apparent from FIG. 3, the imaging region of the first camera 42 is moved in a horizontal direction (Y-direction) with respect to the electronic component 4 and the circuit board 2 when the first camera 42 moves in the up-down, direction (Z-direction). Accordingly, it is possible to adjust the positions of the electronic component 4 and the circuit board 2 within the image that is imaged by the first camera 42, by moving the first camera 42 in the up-down direction (Z-direction). In addition, an optical path length from the first camera 42 to the electronic component 4 and the circuit board 2 is changed when the first camera 42 moves in the horizontal direction (Y-direction). Accordingly, it is possible to match a focus of the first camera 42 to the electronic component 4 and the circuit board 2 by the first camera 42 moving in the horizontal direction (Y-direction). Note that, as shown in FIGS. 6 and 7, according to the type of the electronic component 4, a width of an imaging region R1 of the first camera 42 in the Y-direction may be smaller than a width of the upper face of the electronic component 4 in the Y-direction. In this case, a component mark 4a is not positioned inside the imaging region R1 of the first camera 42 when the first camera 42 is positioned at a suitable position. It is possible to image the entire region of the imaging region R1 by moving the first camera 42 in the up-down direction. Therefore, it is possible to position the component mark 4a within the imaging region R1 of the first camera 42 even in a case where the width of the imaging region R1 of the first camera 42 in the Y-direction is smaller than the width of the upper face of the electronic component 4 in the Y-direction.

Figure 4:
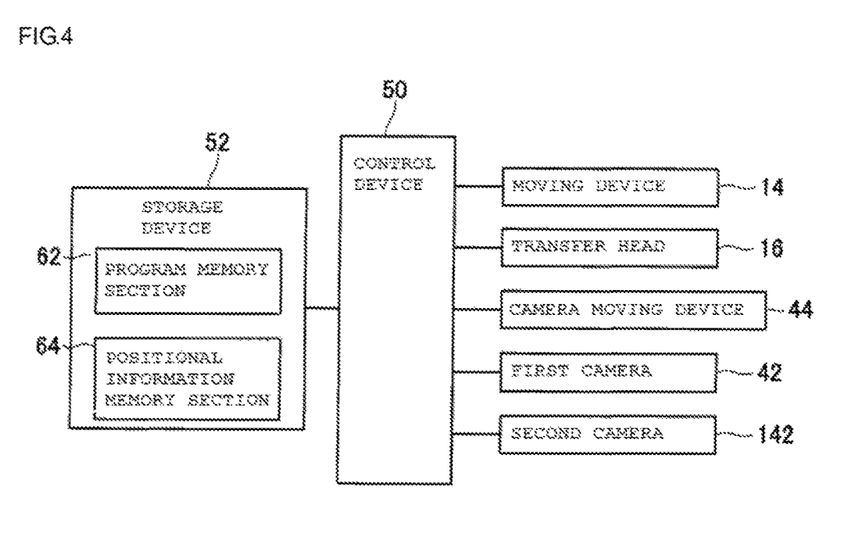
FIG. 4 is a block diagram illustrating a configuration of a control system of the component mounting machine of the first embodiment.

The control device 50 is configured, using a computer that is provided with a CPU, a ROM, and a RAM. As shown in FIG. 4, the moving device 14, the transfer head 16, the camera moving device 44, the first camera 42, and the second camera 142 are connected to able to communicate with the control device 50. The control device 50 mounts the electronic component 4 on the circuit board 2 using the captured image data that is acquired by the imaging unit 40 while controlling operation of each section (14, 16, 44, 42, 142, and the like).

In addition, a storage device 52 is connected to be able to communicate with the control device 50. The storage device 52 stores a program memory section 62 that stores a program for controlling the operation of the component mounting machine 10 and a positional information memory section 64 that stores positional information $p_1$ ($x_1$, $y_1$) of the component mark 4a of the electronic component 4 and positional information $q_1$ ($x_2$, $y_2$) of the board mark 2a of the circuit board 2. The control device 50 controls the operation of each part (14, 16, 44, 42, 142, and the like) of the component mounting machine 10 based on the program that is stored in the program memory section 62. In the component mounting machine 10 of the present embodiment, multiple types of electronic components 4 are mounted on the circuit board 2. The electronic components 4 have different shapes and sizes in each type and have different positions at which the component mark 4a is applied. Therefore, positional information $p_1$ ($x_1$, $y_1$) of the component mark 4a of the electronic components 4 in each type of electronic component is stored in the positional information memory section 64. Here, for example, the positional information $p_1$ ($x_1$, $y_1$) of the component mark 4a is coordinate information (positional information at reference coordinates that are set on the electronic component suction surface of the suction nozzle) of the component mark 4a when the electronic component 4 is suitably sucked by the suction nozzles 20 and 120. For example, suitable suction refers to a state in which a center point of the electronic component suction surface 20a and a center point of the electronic component 4 overlap when the suction nozzle 20 sucks the electronic component 4. In addition, note that, the positional information $p_1$ ($x_1$, $y_1$) of the positional information memory section 64 may be acquired by subjecting the captured image data that is acquired by the imaging unit 40 to image processing, and may acquire in advance from design data, of the electronic component 4. In addition, the positional information $p_1$ ($x_2$, $y_2$) of the board mark 2a of the circuit board 2 is stored in advance in the positional information memory section 64.

Next, positioning processing of the component mark 4a of the electronic component 4 and the board mark 2a of the circuit board 2 that is carried out by the control device 50 will be described using FIGS. 5 to 9. Note that, since a process for mounting the electronic component 4 on the circuit board 2 using the first suction nozzle 20 and a process for mounting the electronic component 4 on the circuit board 2 using the second suction nozzle 120 are the same process, here the process for mounting the electronic component 4 on the circuit board 2 using the first suction nozzle 20 will be described.

Figure 5:
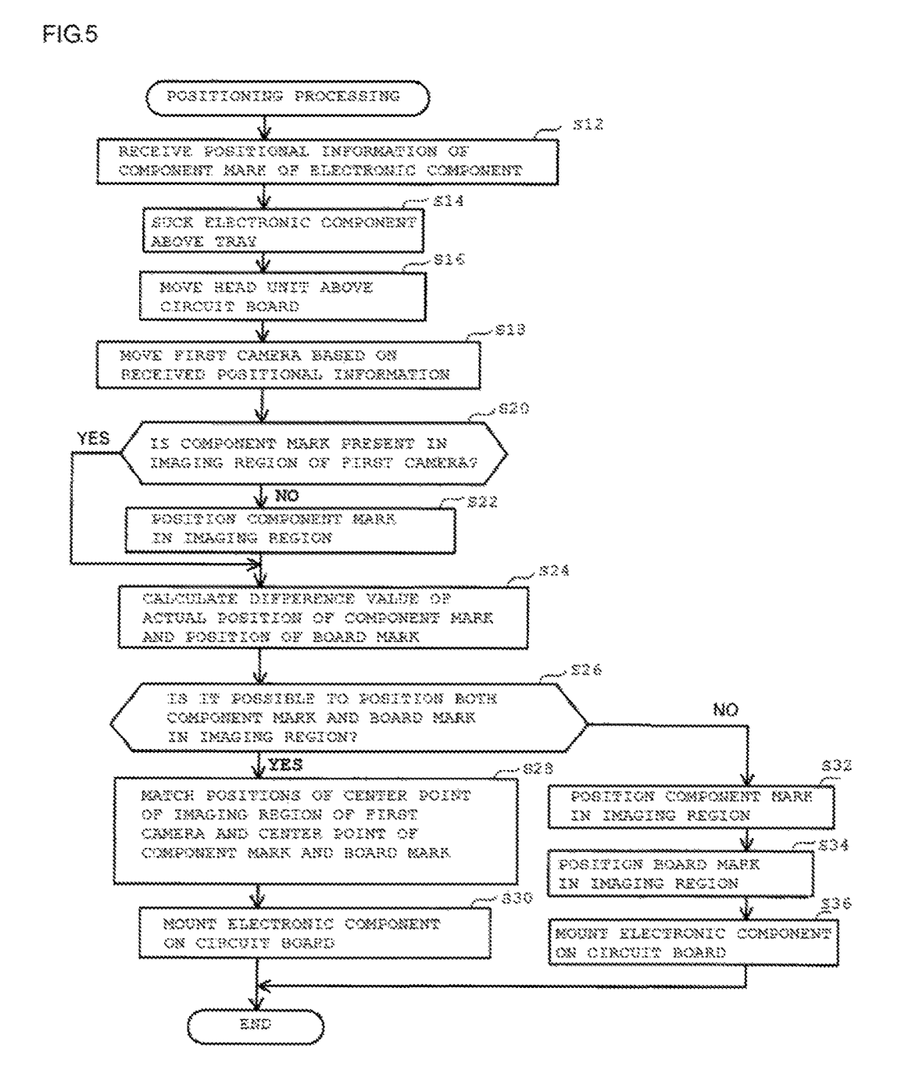
FIG. 5 is a flowchart illustrating positioning processing of the component mounting machine.

As shown in FIG. 5, first, in step S12, the control device 50 receives the positional information $p_1$ ($x_1$, $y_1$) which relates to the component mark 4a of the electronic component 4 from the storage device 52 according to the type of electronic component 4 that is sucked by the first suction nozzle 20. That is, the type of the electronic component 4 that is stored in each of the multiple trays 22 is known. Therefore, first, the control device 50 specifies the type of the electronic component 4 that is sucked by the first suction nozzle 20 according to the tray 22 that is drawn out by the tray feeder 24. Next, the control device 50 reads the positional information $p_1$ ($x_1$, $y_1$) of the electronic component 4 of the specified type from the storage device 52. Note that, the positional information $p_1$ ($x_1$, $y_1$) is coordinate information of the component mark 4a when the electronic component 4 is suitably sucked by the first suction nozzle 20.

Next, in step S14, the control device 50 sucks the electronic component 4 on the tray 22 using the first suction nozzle 20. Next, in step S16, the control device 50 starts driving of the moving device 14 and to move the head unit 12, and causes the first suction nozzle 20 that sucks the electronic component 4 to move above the circuit board 2.

Next, in step S18, the control device 50 causes the first camera 42 to move in the up-down direction by driving the camera moving device 44 based on the positional information $p_1$ ($x_1$, $y_1$) that is received in step S12. Mote that, the control device 50 performs processes S18 to S22 from the start of movement by the head unit 12 using the process of S16 until movement by the head unit 12 upwards of the circuit, board 2. The control device 50 causes the first camera 42 to move in the up-down direction (Z-direction) such that a point designated by the positional information $p_1$ ($x_1$, $y_1$) on the upper face of the electronic component 4 is set in the imaging region R1 of the first camera 42. As already described, the imaging region R1 of the first camera 42 is moved in a horizontal direction (Y-direction) with respect to the electronic component 4 when the first camera 42 is moved in the up-down direction (Z-direction). A state is set in which the component mark 4a of the electronic component 4 is set in the imaging region R1 of the first camera 42 (state indicated in FIG. 6) or a state is set in which the component mark 4a of the component mark 4 is positioned around the imaging region R1 of the first camera 42 (state indicated in FIG. 7(A)) fay moving the first camera 42 in the up-down direction (Z-direction) based on the positional information $p_1$ ($x_1$, $y_1$). That is, the positional information $p_1$ ($x_1$, $y_1$) indicates a position of the component mark 4a when the electronic component 4 is suitably sucked by the first suction nozzle 20. Therefore, the position of the component mark 4a within the imaging region R1 changes according to the suction state of the electronic component 4 to the first suction nozzle 20. Meanwhile, deviation of the suction position of the electronic component 4 with respect to the first suction nozzle 20 is hot deviated so greatly. As a result, a state is set in which the component mark 4a of the electronic component 4 is set in the imaging region R1 of the first camera 42 or a state is set in which the component mark 4a of the component mark 4 is positioned around the imaging region R1 of the first camera 42, in the present embodiment, it is possible to position the component mark 4a within the imaging region R1 of the first camera 42 for a shorter time than in a case where the first camera 42 is moved without, using the positional information $p_1$ ($x_1$, $y_1$) by moving the first camera 42 using the positional information $p_1$ ($x_1$, $y_1$).

Next, in step S20, the control device 50 determines whether or not the component mark 4a of the electronic component 4 is present in the imaging region HI of the first camera 42. In the control device 50, in a case where the component mark 4a is present in the imaging region 81 (YES in S20), step S22 is skipped and the process proceeds to step S24. As shown in FIG. 6, a case where the component mark 4a is present in the imaging region R1 (YES in 820) is a case where the positional information $p_1$ ($x_1$, $y_1$) of the component mark 4a and an actual position $p_1$ ($x_3$, $y_3$) of the component mark 4a are approximately equal. The control device 50 stores the actual position $p_2$ ($x_3$, $y_3$), of the component mark 4a in the storage device 52. In the control device 50, in a case where the component mark 4a is not present in the imaging region R1 (NO in S20), and the process proceeds to step S22. A case where the component mark 4a is not present in the imaging region R1 is a case where the positional information $p_1$ ($x_1$, $y_1$) and the actual position $p_2$ ($x_3$, $y_3$) are largely deviated, for example, when the electronic component 4 is sucked by the first auction nozzle 20. In a case where deviation width in the Y-direction of the positional information $p_1$ ($x_1$, $y_1$) and the actual position $p_2$ ($x_3$, $y_3$) is larger than the width of the imaging region R1 in the Y-direction, the component mark 4a is present outside of the region, of the imaging region R1 even if the imaging region R1 of the first camera 42 is positioned based on the positional information $p_1$ ($x_1$, $y_1$).

Next, in step S22, the control device 50 positions the component mark 4a of the electronic component 4 in the imaging region R1 of the first camera 42. Specifically, the control device 50 searches for the component mark 4a and positions the component mark 4a in the imaging region R1 of the first camera 42 by moving the first camera 42 in the up-down direction (Z-direction) and moving the imaging region R1 of the first camera 42 in the horizontal direction (Y-direction) with respect to the electronic component 4 (for example, a state indicated in FIG. 7(B)). Thereby, it is possible to reliably position the component mark 4a within the imaging region R1 even in a case where the positional information $p_1$ ($x_1$, $y_1$) of the component mark 4a and the actual position $p_2$ ($x_3$, $y_3$) of the component mark 4a that are received from the storage device 52 are different from each other. In addition, a difference between the positional information $p_1$ ($x_1$, $y_1$) and the actual position $p_2$ ($x_3$, $y_3$) is often very small in a case where the first suction nozzle 20 or the camera moving device 44 is normal. Therefore, it is possible to end the process of S22 in a short time. The control device 50 stores the actual position $p_2$ ($x_3$, $y_3$) of the component mark 4a in the storage device 52. In addition, the control device 50 inspects the surface state of the electronic component 4 using the captured image data of the first camera 42 while the head unit 12 moves toward the circuit board 2 (S16 to S22). As a result, it is possible to suppress mounting of the electronic component 4 with an abnormality on the surface on the circuit hoard 2.

Next, in step S24, the control device 50 calculates a difference value W of positions in the X-direction and a difference value H of positions in the Y-direction of the component mark 4a and the board mark 2a based on the actual position $p_2$ ($x_3$, $y_3$) of the component mark 4a and the positional information $q_1$ ($x_2$, $y_2$) of the board mark 2a. The difference value W is a difference value of $x_3$ and $x_2$, and the difference value H is a difference value of $y_3$ and $y_2$. Next, in step S26, the control device 50 determines whether or not it is possible to position both the component mark 4a and the board mark 2a in the imaging region R1 of the first camera 42. The control device 50 proceeds to step S28 in a case where it is possible to position both the Component mark 4a and the board mark 2a in the imaging region R1 (YES in S26). The control device 50 proceeds to step S32 in a case where it is not possible to position both the component mark 4a and the board mark 2a in the imaging region R1 (NO in 326). A case where it is not possible to position both the component mark 4a and the board mark 2a in the imaging region R1 is a case where the difference value W is larger than the width of the imaging region R1 in the X-direction or the difference value H is larger than the width of the imaging region R1 in the Y-direction.

Figure 7A:
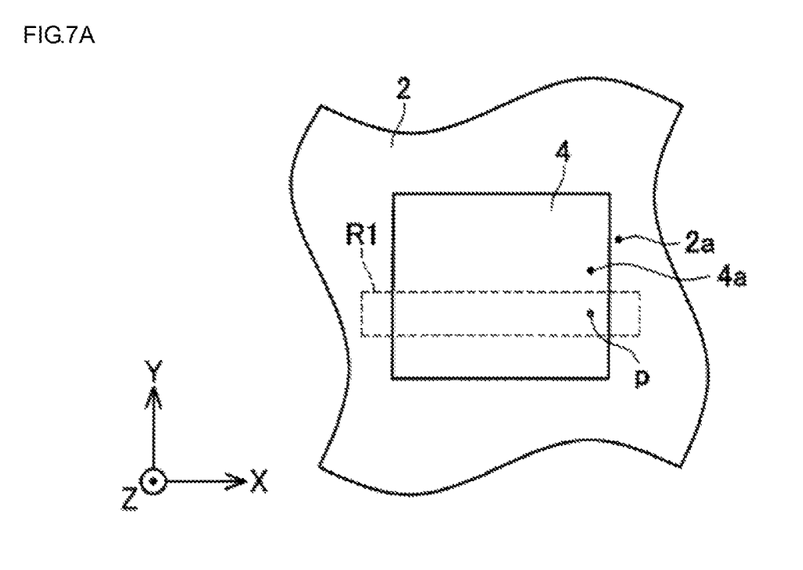
FIG. 7A is a diagram illustrating an example of a state in which the component mark is not set in the imaging region of the first camera in a case where the first camera is positioned based on the positional information within the memory section.
Figure 7B:
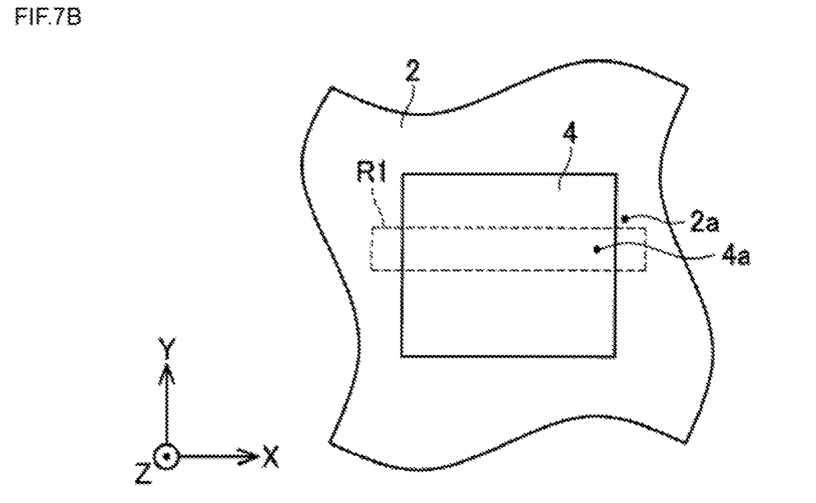
FIG. 7B is a diagram illustrating an example of a state in which the first camera is positioned such that the component mark is set in the imaging region of the first camera.
Figure 7C:
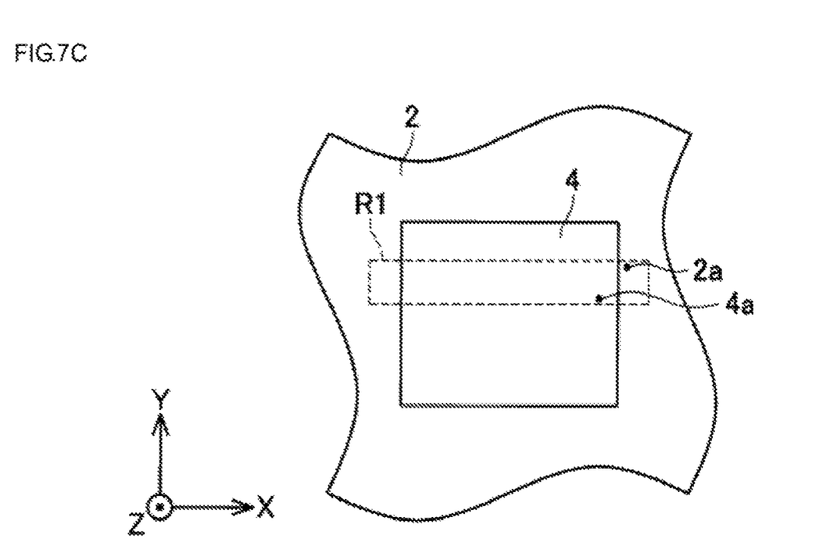
FIG. 7C is a diagram illustrating an example of a state in which the first camera is positioned such that a board mark is set in the imaging region of the first camera.
Figure 7D:
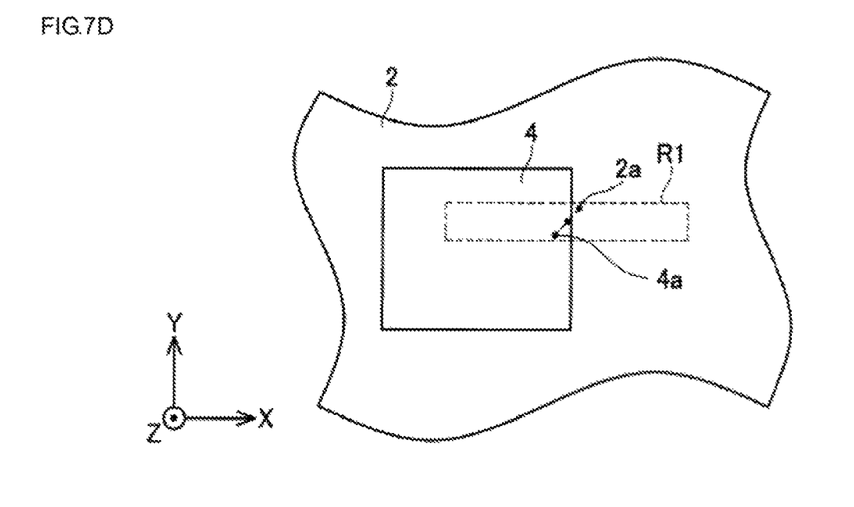
FIG. 7D is a diagram illustrating an example of a state in which the first camera is positioned such that a center point of the component mark and the board mark and a center point of the imaging region of the first camera overlap.

Next, in step S28, the control device 50 causes the first camera 42 to move in the up-down direction (Z-direction) and/or the head unit 12 on the horizontal plane (X-direction and/or Y-direction) such that the position of the center point of the imaging region R1 of the first camera 42 and the position of the center point of the component mark 4a and the board mark 2a overlap (state indicated in FIG. 7(D)). When configuring in this manner, it is possible to prevent the component mark 4a or the board mark 2a from coming away from the imaging region R1 when mounting on the circuit board 2 of the electronic component 4 that is carried out after step S28. For example, the board mark 2a tends not to come away from the imaging region R1 more in a ease where the circuit board 2 moves in a right direction with respect to the electronic component 4 from the state in FIG. 7(D) than in a case where the circuit board 2 moves in the right direction with respect to the electronic component 4 from the state in FIG. 7(C).

Next, in step S30, the control device 50 mounts the electronic component 4 on the circuit board 2. Specifically, first, the control device 50 determines the mounting position of the electronic component 4 from a relative position of the component mark 4a and the board mark 2a that is positioned in the imaging region R1. Next, the control device 50 finely adjusts the first suction nozzle 20 in the X-direction and the Y-direction based on the determined mounting position. The control device 50 lowers the first suction nozzle 20 using the transfer head 16 and mounts the electronic component 4 on the circuit board 2 if the first suction nozzle 20 is moved to the mounting position.

Meanwhile, in the case of NO in step S26, in step S32, the control device 50 repositions the component mark 4a of the electronic component 4 in the imaging region R1 of the first camera 42. The control device 50 adjusts such that the component mark 4a is positioned within the imaging region R1 by moving the first camera 42 in the up-down direction (Z-direction) and moving the imaging region R1 of the first camera 42 in the horizontal direction (Y-direction) with respect to the circuit board 2. The actual position $p_2$ ($x_3$, $y_3$) of the component mark 4a is acquired while the transfer head 16 moves. It is possible to improve accuracy of the actual position of the component mark 4a by acquiring an actual position $p_3$ ($x_4$, $y_4$) of the component mark 4a in a state in which the transfer head 16 is stopped. Thereby, it is possible to improve mounting accuracy of the electronic component 4 on the circuit board 2 by improving accuracy of the actual position of the component mark 4a. Note that, a difference between, the actual position $p_2$ ($x_3$, $y_3$) and the actual position $p_3$ ($x_4$, $y_4$) is often very small. Therefore, it is possible to end the process of S26 in a short time. The control device 50 updates the actual position $p_2$ ($x_3$, $y_3$) that is stored in the storage device 52 of the component mark 4a to the actual position $p_3$ ($x_4$, $y_4$).

Next, in step S34, the control device 50 positions the board mark 2a of the circuit board 2 in the imaging region R1 of the first camera 42. The control device 50 adjusts such that the board mark 2a is positioned within the imaging region R1 by moving the first camera 42 in the up-down direction (Z-direction) and moving the imaging region R1 of the first camera 42 in the horizontal direction (Y-direction) with respect to the circuit board 2. The control device 50 stores the actual position $q_2$ ($x_5$, $y_5$) of the board mark 2a in the storage device 52.

Next, in step S36, the control device 50 mounts the electronic component 4 on the circuit board 2. Specifically, the control device 50 determines the mounting posit ion of the electronic component 4 based on the actual position $p_3$ ($x_4$, $y_4$) of the component mark 4a and the actual position $q_2$ ($x_5$, $y_5$) of the board mark 2a that are stored in the storage device 52, The control device 50 lowers the first suction nozzle 20 using the transfer head 16 and mounts the electronic component 4 on the circuit board 2 if the first suction nozzle 20 is moved to the mounting position. It is possible to omit the process of S32 since the control device 50 shortens the time that is necessary for mounting of the electronic component 4 on circuit board 2. In this case, the control device 50 determines the mounting, position of the electronic component 4 based on the actual, position $p_2$ ($x_3$, $y_3$) of the component mark 4a and the actual position $q_2$ ($x_5$, $y_5$) of the board mark 2a. Note that, the description above relates only to positioning processing that uses the first suction nozzle 20 and the first camera 42, but the second suction nozzle 120 and the second camera 142 perform the same processes.

As apparent from the above description, in the component mounting machine 10 of the present embodiment, it is possible to move the position of the first camera 42 based on the positional information $p_1$ ($x_1$, $y_1$) of the component mark 4a of the electronic component 4 that is stored in the positional information memory section 64. It is possible to position the component mark 4a in the imaging region R1 by further moving the first camera 42 when the component mark 4a is not positioned within the imaging region R1 of the first camera 42. When configuring in this manner, it is possible to shorten the time that is necessary in positioning of the component mark 4a in the imaging region R1 and it is possible to reliably position the component mark 4a in the imaging region R1.

Second Embodiment

Points of difference with the first embodiment will be described using FIGS. 8 and 9. Note that, description of the configuration that is common with the first embodiment is omitted. In the second embodiment, the configuration of a head unit 212 and the configuration of an imaging unit 240 are different from the first embodiment.

Figure 8:
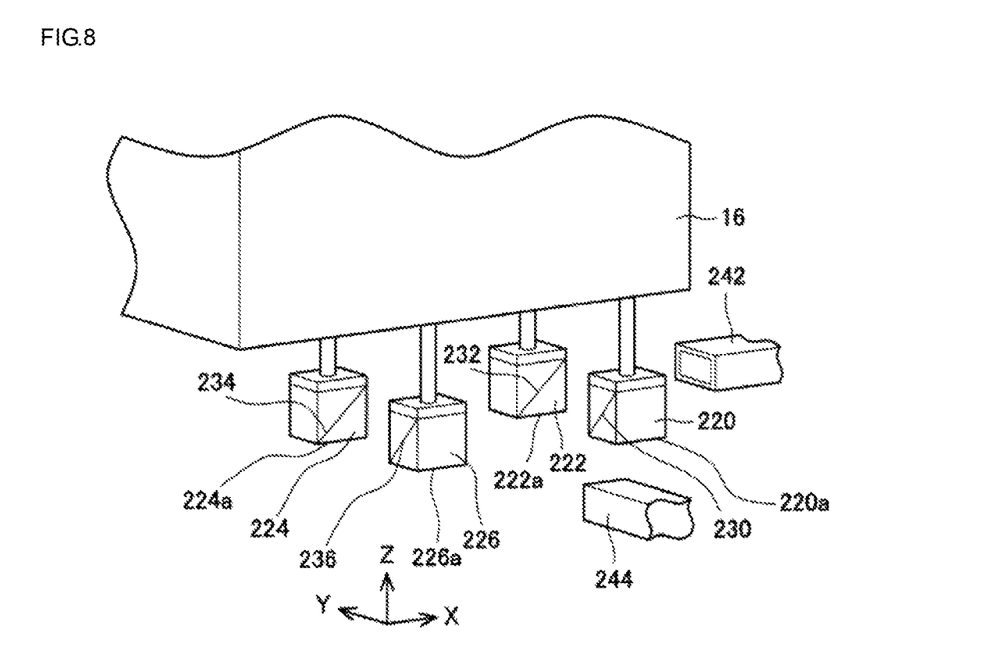
FIG. 8 is a perspective view illustrating a configuration of a head unit and an imaging unit of a second embodiment.

As shown in FIG. 8, the head unit 212 is provided with the transfer head 16, and four suction nozzles 220, 222, 224, and 226 that are attached to the transfer head 16. The suction nozzle 222 is disposed spaced apart in the Y-direction with respect to the suction nozzle 220. The suction nozzle 226 is disposed spaced apart in the x-direction with respect to the suction nozzle 220. The suction nozzle 224 is disposed spaced apart in the X-direction and the Y-direction with respect to the suction nozzle 220. The suction nozzle 224 is attached to the transfer head 16 such that the position of the suction nozzle 224 in the Y-direction is the same position as the suction nozzle 222 in the Y-direction. In addition, the position of the suction nozzle 224 in the X-direction is attached to the transfer head 16 so as to be the same position as the suction nozzle 226 in the X-direction. Note that, the suction nozzle 220 and the suction nozzle 226 have the same configuration. In addition, the suction nozzle 222 and the suction nozzle 224 have the same configuration. Each suction nozzle is attached to the transfer head 16 that is movable in the up-down direction (Z-direction in the drawings). Each suction nozzle is independently movable in the up-down direction.

The suction nozzle 220 is provided with a mirror 230 above a suction surface 220a. The mirror 230 converts light from the upper face of the electronic component 4 that is sucked to the suction surface 220a in the Y-direction. The suction nozzle 222 is provided with a mirror 232 above a suction surface 222a. The mirror 232 converts the optical path of light from the upper face of the electronic component 4 that is sucked toy the suction surface 222a in the x-direction.

Figure 9:
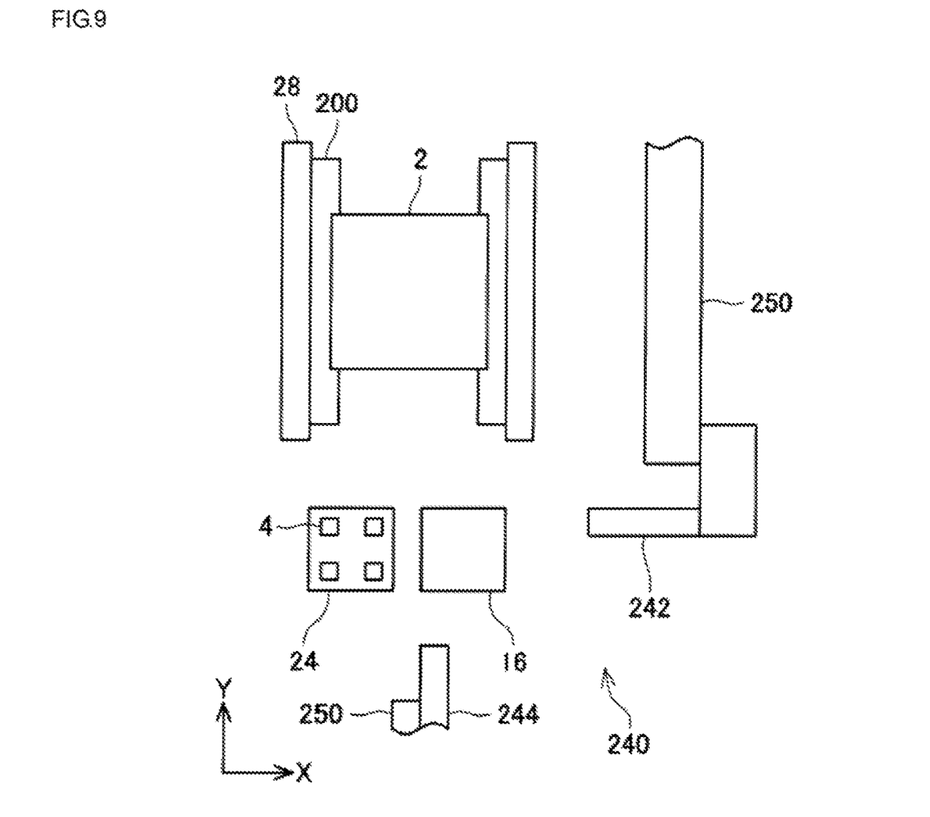
FIG. 9 is a top view schematically illustrating a configuration in the second embodiment.

As shown in FIG. 9, the imaging unit 240 is attached to an imaging unit holding section 250. The imaging unit holding section 250 is disposed adjacent to the tray feeder 24 in the X-direction. In addition, the imaging unit holding section 250 is disposed adjacent to the board conveyor 28 in the Y-direction. The imaging unit 240 is provided with a first camera 242 and a second camera 244. Note that, it is possible for the moving device 14 to move the head unit 12 relatively to the imaging unit 240. The first camera 242 is spaced apart in the X-direction with respect to the suction nozzle 222, and the tray feeder 24 and the imaging unit holding section 250 are disposed lined up at the imaging unit holding section 250 side. Therefore, the first camera 242 is able to receive light that is changed in the optical path by the mirrors 232 and 234. The second camera 244 is spaced apart in the Y-direction with respect to the suction nozzle 226, and the board holding section 200 and the imaging unit holding section 250 are disposed lined up at the imaging unit holding section 250 side. Therefore, the second camera 244 is able to receive light that is changed in the optical path by the mirrors 230 and 236. When configuring in this manner, it is possible to simultaneously image the suction nobles using the first camera 242 and the second camera 244.

An imaging method of the second embodiment will be described. First, the control device 50 adjusts the position of the suction nozzle 224 in the Y-direction so as to be the same as the position of the first camera 242 in the Y-direction and the position of the suction nozzle 226 in the X-direction so as to be the same as the position of the second camera 244 in the X-direction by driving the moving device 14 and moving the head unit 12 on the horizontal plane (X-direction and/or Y-direction). At this time, the transfer head 16 moves the suction nozzle 222 in the Z-direction, and adjusts the position at which the suction nozzle 222 does not hinder the optical path of the light that is changed in the optical path using the mirror 234. When configuring in this manner, the first camera 242 is able to receive light that is changed in the optical path using the mirror 234 and the second camera 244 is able to receive light that is changed in the optical path using the mirror 236. That is, the first camera 242 images the electronic component 4 and the circuit board 2 that are sucked, by the suction nozzle 224 and the second camera 244 images the electronic component 4 and the circuit board 2 that are sucked by the suction nozzle 226. Next, the control device 50 adjusts the position of the suction nozzle 220 in the X-direction so as to be the same as the position of the second camera 244 in the X-direction by driving the moving device 14 and moving the head unit 12 on the horizontal plane (X-direction and/or Y-direction). The transfer head 16 adjusts the position of the suction nozzle 222 in the Z-direction so as to be the same as the position of the first camera 242 in the Z-direction by moving the suction nozzle 222 in the Z-direction. When configuring in this manner, the first camera 242 is able to receive light that is changed in the optical path using the mirror 232 and the second camera 244 is able to receive light that is changed in the optical path using the mirror 230. That is, the first camera 242 images the electronic component 4 and the circuit board 2 that are sucked by the suction nozzle 222 and the second camera 244 images the electronic component 4 and the circuit board 2 that are sucked by the suction nozzle 224. After that, the transfer head 16 is moved on the horizontal plane, the suction nozzle moves to the mounting position on the circuit board 2, and the electronic component 4 that is sucked by the suction nozzle is mounted. As a result, it is possible to image the suction nozzles 220, 222, 224, and 226 by imaging by two passes. In addition, it is possible to shorten a movement distance of the transfer head 16 from sucking of the electronic component 4 using the suction nozzle until mounting the component 4 on the circuit board 2 since the imaging unit 240 is provided adjacent to the tray feeder 24 and the board holding section 200. Furthermore, the transfer head 16 does not interfere with, the cameras 242 and 244 when entering/exiting the imaging region of the cameras 242 and 244 since the first camera 242 and the second camera 244 of the imaging unit 240 are installed at the apposite side from the imaging unit holding section 250. Accordingly, the transfer head 16 may move only horizontally without there being a need to retreat in the up-down direction when entering/exiting the imaging region of the cameras 242 and 244.

Embodiments according to the technique of the disclosure in the present description are described in detail above, but are merely examples and are not limited to the scope of the claims. Various modifications and changes of the specific examples that are exemplified above are included in the technology described in the scope of the claims.

In each embodiment described above, the positional information $p_1$ ($x_1$, $y_1$) of the component mark 4a of the electronic components 4 is stored in advance in the storage device 52. However, the positional information $p_1$ ($x_1$, $y_1$) that is stored in the storage device 52 may be corrected using the actual position $p_2$ ($x_3$, $y_3$) or the actual position $p_3$ ($x_4$, $y_4$).

Technical elements that are described in the present description or the drawings exhibit technical usefulness using one or various combinations, but are not limited to the combination as claimed at the time of filing. In addition, the technology that is exemplified in the present description or the drawings simultaneously achieves multiple objects, and achieving one object therein has implicit technical usefulness.

The invention claimed is:

1. A component mounting machine mounting a component, which has a component mark for positioning and mounting on an upper surface thereof, on a circuit board, comprising:
 a first suction nozzle that includes a suction surface that suctions the upper surface of the component;
 a transfer head that supports the first suction nozzle and mounts the component that is sucked by the first suction nozzle on the circuit board by moving the first suction nozzle relatively to the circuit board;
 an optical path conversion device mounted on the first suction nozzle and disposed above the suction surface and converts an optical path of light from the upper surface of the component to a side of the first suction nozzle;
 a first camera mounted at a position to receive, from the upper surface of the component, light that is changed in the optical path by the optical path conversion device;
 a camera moving device that moves the first camera relatively to the first suction nozzle; and
 a control device configured to control operation of the transfer head and the camera moving device,
 wherein the control device is configured to control the camera moving device to move the first camera in at least a first direction that is orthogonal to an optical axis of the first camera,
 an imaging region of the first camera moves in a second direction with respect to a center of the component when the first camera moves in the first direction,
 the control device is provided with a memory section that stores, in advance, positional information of the component mark, and
 the control device is configured to control the first suction nozzle to suck the component and to control the camera moving device to move the first camera based on the positional information stored within the memory section.

2. The component mounting machine according to claim 1,
 wherein the control device is configured to position the component mark within the imaging region of the first camera by further moving the first camera using the camera moving device when the component mark is not positioned within the imaging region of the first camera in a case where the component is sucked by the first suction nozzle and the first camera is moved by the camera moving device based on the positional information within the memory section.

3. The component mounting machine according to claim 1,
 wherein the first camera is disposed on an optical path that is changed in the optical path conversion device,
 the control device is configured to control the camera moving device to move the first camera in at least an up-down direction with respect to the first suction nozzle,
 the imaging region of the first camera moves in a direction that is parallel to the optical path that is changed by the optical path conversion device with respect to the center of the component when the first camera moves in the up-down direction, and
 the control device is configured to control the first suction nozzle to suck the component and control the camera moving device to move the first camera in the up-down direction based on the positional information within the memory section.

4. The component mounting machine according to claim 1,
 wherein the control device is configured to position the component mark within the imaging region of the first camera by further moving the first camera in an up-down direction using the camera moving device when the component mark is not positioned within the imaging region of the first camera in a case where the component is sucked by the first suction nozzle and the first camera is moved by the camera moving device based on positional information within the memory section.

5. The component mounting machine according to claim 1,
wherein the circuit board has a board mark for positioning,
the optical path conversion device converts an optical path of light from an upper surface of the circuit board to the side of the first suction nozzle,
the first camera is disposed at a position to receive, from the upper surface of the circuit board, light that is changed in the optical path by the optical path conversion device, and
the control device is configured to determine a mounting position of the component on the circuit board based on a relative position of the component mark and the board mark that are imaged by the first camera.

6. The component mounting machine according to claim 5,
wherein the control device is configured to position both of the component mark and the board mark within the imaging region of the first camera by moving the first camera using the camera moving device.

7. The component mounting machine according to claim 6,
wherein the control device is configured to position the imaging region of the first camera such that a center point of the imaging region of the first camera and a center of the component mark and a center of the board mark overlap by moving the first camera using the camera moving device.

8. The component mounting machine according to claim 1, further comprising:
a second suction nozzle that includes a suction surface that sucks the upper surface of the component and an optical path conversion device that is disposed above the suction surface and converts the optical path of light from the upper surface of the component to a side of the second suction nozzle; and
a second camera mounted at a position to receive light, from the upper surface of the component that is sucked by the second suction nozzle, which is changed in the optical path by the optical path conversion device of the second suction nozzle,
wherein the transfer head supports the first suction nozzle and the second suction nozzle and mounts the component that is sucked by the first suction nozzle and the second suction nozzle on the circuit board by moving the first suction nozzle and the second suction nozzle relatively to the circuit board,
the first camera and the second camera are disposed such that the optical axis of the first camera and an optical axis of the second camera are parallel,
the camera moving device relatively moves each of the first camera and the second camera in a direction that is orthogonal to the optical axes of the first and second cameras with respect to the first suction nozzle and the second suction nozzle, and
the control device is configured to control the operation of the transfer head and the camera moving device based on captured image data of the first camera and captured image data of the second camera.

9. The component mounting machine according to claim 8,
wherein the first camera, the second camera, and the camera moving device are attached to the transfer head and relatively move with respect to the circuit board integrally with the transfer head, and
the control device is configured to inspect a surface state of each component that is sucked by the first suction nozzle and the second suction nozzle by using the captured image data of the first camera and the captured image data of the second camera after the component is sucked by each of the first suction nozzle and the second suction nozzle until mounting the component on the circuit board in a case where the component is sucked by each of the first suction nozzle and the second suction nozzle and is mounted on the circuit board.

* * * * *

UNITED STATES PATENT AND TRADEMARK OFFICE
CERTIFICATE OF CORRECTION

PATENT NO. : 10,743,447 B2
APPLICATION NO. : 15/553652
DATED : August 11, 2020
INVENTOR(S) : Masaki Murai et al.

It is certified that error appears in the above-identified patent and that said Letters Patent is hereby corrected as shown below:

On the Title Page

Item (71), the Applicant's information is incorrect. Item (71) should read:
--(71) Applicant: FUJI CORPORATION, Chiryu-shi (JP)--

Signed and Sealed this
Tenth Day of November, 2020

Andrei Iancu
*Director of the United States Patent and Trademark Office*